United States Patent
Harrington

(10) Patent No.: US 9,161,480 B2
(45) Date of Patent: Oct. 13, 2015

(54) VACUUM PUMPED LIQUID COOLING SYSTEM FOR COMPUTERS

(71) Applicant: Steve Harrington, Cardiff, CA (US)

(72) Inventor: Steve Harrington, Cardiff, CA (US)

(73) Assignee: Chilldyne, Inc., Carlsbad, CA (US)

( * ) Notice: Subject to any disclaimer, the term of this patent is extended or adjusted under 35 U.S.C. 154(b) by 186 days.

(21) Appl. No.: 13/938,726

(22) Filed: Jul. 10, 2013

(65) Prior Publication Data

US 2014/0190660 A1  Jul. 10, 2014

Related U.S. Application Data

(63) Continuation of application No. 12/762,898, filed on Apr. 19, 2010, now abandoned.

(51) Int. Cl.
| | |
|---|---|
| H05K 7/20 | (2006.01) |
| F28D 7/02 | (2006.01) |
| F28F 1/16 | (2006.01) |
| F28F 7/02 | (2006.01) |
| G06F 1/20 | (2006.01) |
| F28D 21/00 | (2006.01) |

(52) U.S. Cl.
CPC ............ *H05K 7/20836* (2013.01); *F28D 7/028* (2013.01); *F28F 1/16* (2013.01); *F28F 7/02* (2013.01); *G06F 1/20* (2013.01); *H05K 7/2079* (2013.01); *H05K 7/20272* (2013.01); *F28D 2021/0019* (2013.01); *F28F 2215/00* (2013.01)

(58) Field of Classification Search
CPC ... F04B 9/117; H01L 23/473; H05K 7/20272; H05K 7/20281

USPC .......... 165/11.1, 80.4, 156, 169; 417/46, 120, 417/144, 148, 390, 393
See application file for complete search history.

(56) References Cited

U.S. PATENT DOCUMENTS

| | | | |
|---|---|---|---|
| 3,334,684 A | 8/1967 | Roush et al. | |
| 4,287,941 A * | 9/1981 | Allen .............................. | 165/70 |
| 4,698,728 A | 10/1987 | Tustaniwskyj et al. | |
| 4,721,996 A | 1/1988 | Tustaniwskyj et al. | |
| 4,967,832 A | 11/1990 | Porter | |
| 4,974,774 A * | 12/1990 | Nakagawa et al. ............. | 600/18 |
| 5,048,599 A | 9/1991 | Tustaniwskyj et al. | |
| 5,406,807 A | 4/1995 | Ashiwake et al. | |
| 5,887,619 A | 3/1999 | Keary | |
| 6,161,578 A | 12/2000 | Braun et al. | |
| 6,193,472 B1 * | 2/2001 | Peterson et al. ................ | 417/87 |
| 6,371,157 B1 | 4/2002 | See et al. | |
| 6,478,552 B1 * | 11/2002 | Batten et al. .................. | 417/393 |
| 6,615,911 B1 | 9/2003 | Bhatti et al. | |
| 6,655,449 B1 | 12/2003 | Hsien | |
| 6,760,221 B2 | 7/2004 | Goth et al. | |

(Continued)

*Primary Examiner* — Frantz Jules
*Assistant Examiner* — Nelson Nieves
(74) *Attorney, Agent, or Firm* — Manuel de la Cerra

(57) ABSTRACT

A reliable, leak tolerant liquid cooling system with a backup air-cooling system for computers is provided. The system may use a vacuum pump and a liquid pump in combination to provide negative fluid pressure so that liquid does not leak out of the system near electrical components. The system distributes flow and pressure with a series of pressure regulating valves so that an array of computers can be serviced by a single cooling system. The system provides both air and liquid cooling so that if the liquid cooling system does not provide adequate cooling, the air cooling system will be automatically activated. A connector system is provided to automatically evacuate the liquid from the heat exchangers before they are disconnected.

17 Claims, 5 Drawing Sheets

(56) References Cited

U.S. PATENT DOCUMENTS

| | | |
|---|---|---|
| 6,924,981 B2 | 8/2005 | Chu et al. |
| 7,149,084 B2 | 12/2006 | Matsushima et al. |
| 7,310,230 B2 | 12/2007 | Tustaniwskyi et al. |
| 7,508,665 B1 | 3/2009 | Palmer |
| 2002/0025263 A1* | 2/2002 | Graziani et al. .............. 417/390 |
| 2007/0039719 A1 | 2/2007 | Eriksen |

* cited by examiner

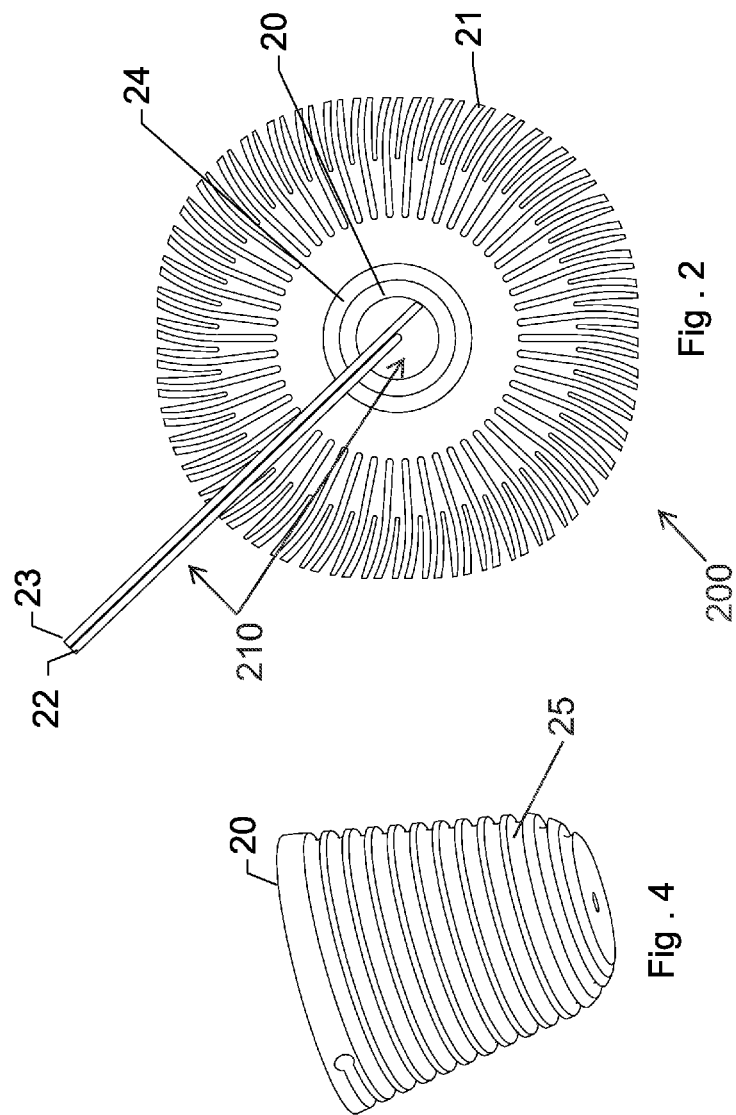
Fig. 2
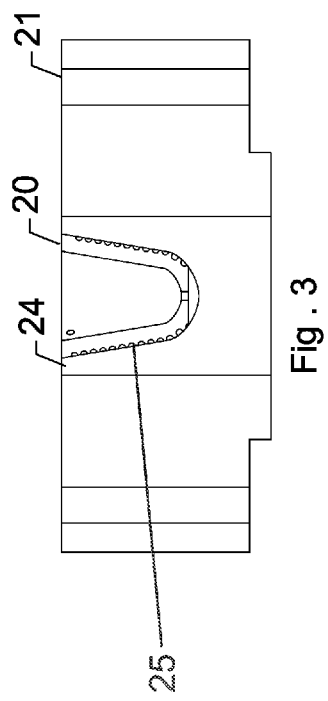
Fig. 3
Fig. 4

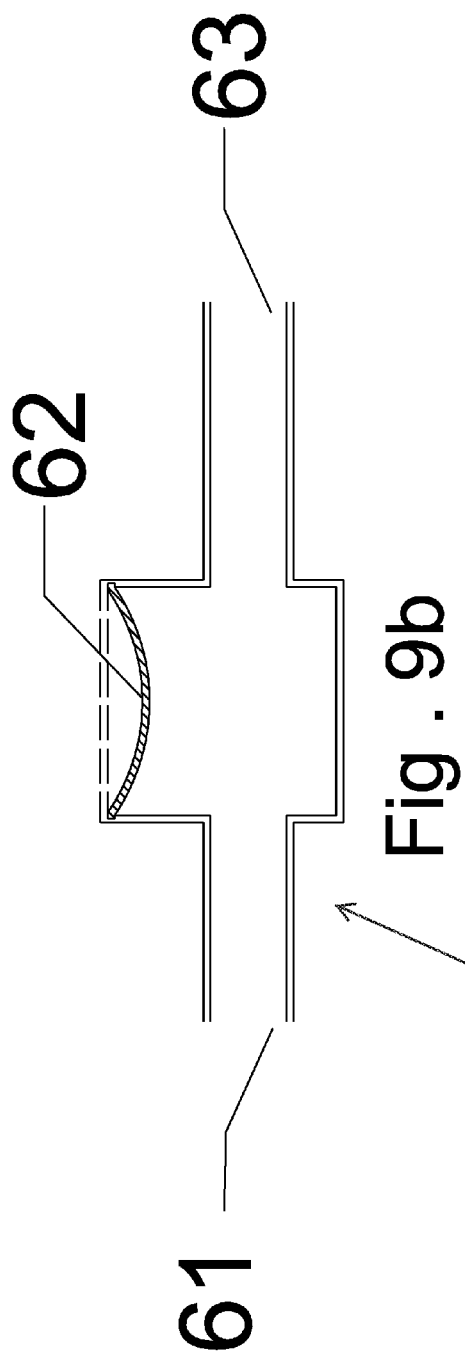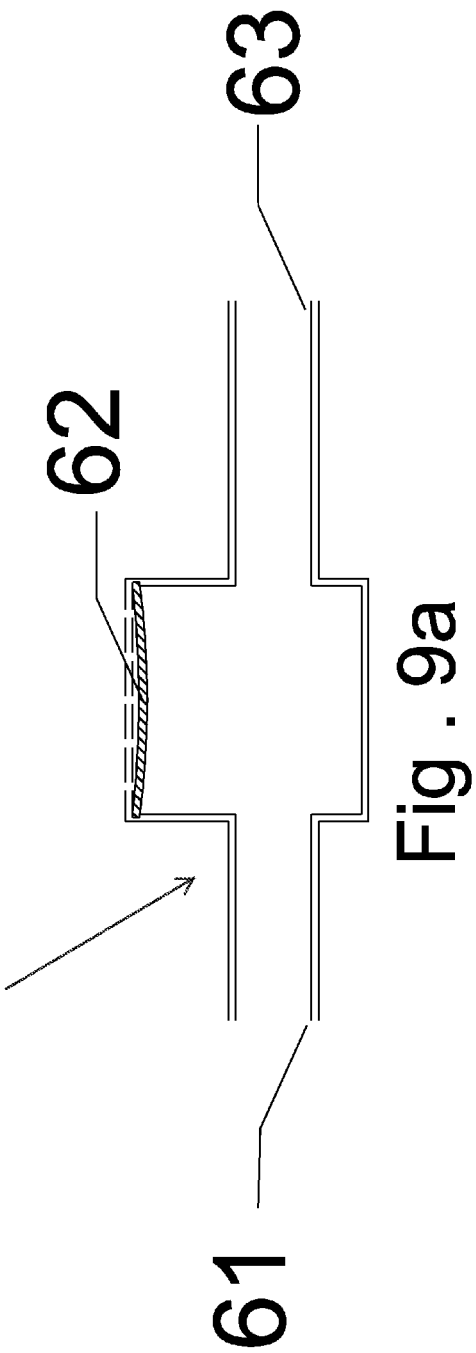

VACUUM PUMPED LIQUID COOLING SYSTEM FOR COMPUTERS

BACKGROUND OF THE DISCLOSURE

Brief Description of the Related Art

Arrays of electronic computers, such as are found in data centers, generate a great deal of heat. A typical CPU puts out over 100 watts and has a maximum case temperature of about 60 C. A typical rack of 88 CPUs may put out 9 Kw. The maximum outside temperature at a hot urban location might be 45 C, so the heat flow goes with the gradient. Theoretically, no refrigeration should be required, yet the standard way to keep data centers cool is to use vapor compression refrigeration systems at least part of the time. These systems often use more power that the computers themselves. These systems use air as the heat transfer medium, and it is due to the low heat capacity and thermal conductivity of air that refrigeration must be used to overcome the thermal resistance of multiple air heat exchangers. Some operators use evaporation of water to cool water-to-air heat exchangers which then in turn cool computers, and this is more efficient than refrigeration, but the computers run hotter, thus reducing their reliability and making the data center uncomfortable. Water has 4000 times more heat capacity that air of the same volume, so water is an ideal heat transfer agent for direct heat transfer from the heat generating components. However, operators of server systems are concerned about leaks and reliability of water-cooled computers. One potential issue with water-cooled negative pressure systems is that at low absolute pressures, water may boil. For example, at 50 C, water boils at 4 in Hg, so the system pressure cannot get that low. Therefore, a pump must be used with low NPSH, so that the water does not cavitate at the pump inlet. One such pump is described by the inventor in U.S. Pat. No. 7,611,333, the disclosure of which is incorporated herein by reference. What is needed is a cooling solution adaptable for up to a large number of computers, that uses a minimum amount of water flow, is reliable, leak-free and low in power consumption.

Therefore it is an object of the present invention to provide a reliable cooling system to a large number of CPUs under negative pressure, with a minimal chance of leakage, and with an air cooling backup system. It is also an object of the present invention to provide a cooling solution which integrates with an air cooled heat sink for backup and utilizes only the minimum amount of water to provide adequate cooling for each heat generating element. Furthermore, it is an object of the present invention to provide a device to disconnect and reconnect servers without losing any water.

SUMMARY OF THE DISCLOSURE

A system provides water cooling under negative pressure for an array of computers or other heat generating devices with a minimal flow rate and a minimal volume of water in order to provide cooling in an efficient and reliable manner. In certain embodiments the system includes an outdoor cooling tower to cool water, a water distribution system to supply water to multiple CPUs, high performance heat exchangers to remove heat from said CPUs with a minimum flow rate and delta pressure, a water pump to suck water through said CPUs and a vacuum pump to remove any air which may enter the system. In addition the system may include an air-cooled heat exchanger attached to each CPU to remove the heat in the event that the liquid cooling system is not operating.

The system may use a cooling tower to cool down the water using convection and evaporation in order to reduce the temperature to the local wet bulb temperature or whatever temperature is required by the CPUs, which is typically less than 30 C. The cool water is preferably provided under a pressure which is less than the local atmospheric pressure to a rack and then to a server with one or more heat generating components, such as CPUs. The entire system preferably runs at a low absolute pressure, so that any leaks are of air into the system, rather than water out of the system. This limits the available delta pressure available to each heat exchanger to the difference between the vapor pressure of the warmest water within the system and the local absolute pressures. Therefore, delta pressures are allocated to each heat exchanger that are substantially less than 1 atmosphere. The water-cooled heat exchanger is preferably mounted to the CPU and comprises a passage with a turbulator to increase the velocity and turbulence of the water near the heat transfer surface. The turbulator may also be designed to minimize the volume of water contained within the server so that the water may be quickly cleared for repairs. The CPU typically includes an air-cooled heat exchanger with fins and a fan located nearby to provide air-cooling. The fan may be controlled by the temperature of the CPU so that as it gets hotter, the fan increases in speed. The liquid flow rate may be determined by the acceptable temperature rise of the liquid and the power dissipated by the CPU. For a typical CPU that puts out 100 watts, a stream of water at 150 cc/minute will result in a temperature rise of approximately 10 C. The temperature differential from the CPU case to the water should be of the same order as the temperature rise. The heat exchanger should have a pressure drop of approximately 4 in Hg so that the system will work properly on a hot day in a high altitude location, where the difference between the local atmospheric pressure and the vapor pressure of the hot water can be only 8 inches Hg.

The fan which is connected to the CPU heat exchanger may also be used to cool the interior of the computer by transferring heat from the air inside the computer to the water so that other components within the server enclosure may be cooled with or without the use of external air flow.

The water reservoir is preferably at lower pressure than the devices being cooled. This can be accomplished by keeping the reservoir at a lower elevation than the CPU or by means of a check valve with a given cracking pressure or a pressure regulator. This will provide negative pressure at the CPU by means of gravity head. The water distribution system provides the water at a pressure of approximately −2 in Hg to the servers. This may be accomplished by means of the system design, or by placing a pressure-regulating valve at the server or rack level. The plumbing from the fluid supply reservoir to the server may require a pump if the server is at a significantly higher elevation than the cooling tower, such as if it is on a different floor than the cooling tower. The supply pump speed may be controlled so that the pressure at the server is at the correct value.

The plumbing to and from the server may be designed for low pressure drop, so as to keep the total system delta pressure within limits. Alternatively, the plumbing to the server racks may be high pressure plumbing supplied by a pump, with a pressure regulator to reduce the pressure to below atmospheric as the water gets close to the electronics. For the return system, larger pipes may be required for the flow of air and water, as air will be introduced to the system as servers are removed or replaced. Local air removal systems may be used in order to prevent the return plumbing from getting too large. Such systems may use local vacuum pumps, plumbing to a central vacuum pump, or float actuated valves and multiple compartments, as in U.S. Pat. No. 4,967,832, which is incorporated herein by reference in its entirety.

Server Pressure Regulators

Each server may have an inlet pressure regulator and an outlet pressure regulator in order to maintain a desired delta pressure across the CPU heat exchanger. Each CPU will typically have a temperature sensor, and an increase in temperature over the inlet water temperature may indicate a problem with the heat exchanger. This may be used to indicate a need for repair. A temperature sensor, such as a thermistor, may be used to measure the inlet water temperature. Flowmeters, such as a rotameter or turbine meter with a digital readout, may also be used to monitor the flow. A filter may be used after the cooling tower and before the heat exchanger to prevent clogging of the heat exchanger passages. Chemical additives may be used to prevent fouling of the heat exchanger with biological films and to prevent corrosion. The internal heat exchanger passages may be plated or anodized to prevent corrosion.

Local Air Release

A vacuum reservoir may be located at each server rack, and it may have a float actuated air release to allow for the release of any accumulation of air. Such local air release systems may require local vacuum pumps or connection to a central vacuum system.

Interconnect with Draining Provision

Each server or server rack may be connected with a dry disconnect system that allows for the automatic draining of the server system. This connector may include the supply and return flows. Such flows may be coaxial, in order to allow for a small interconnect. The system is preferably designed to remove all of the water from inside each subsystem such as a CPU, server or server rack during the disconnection process. For example, if the server contains 1 cc of water, and the flow rate is 150 cc/minute of water, then it will take less than 1 second to drain the water out of the system. As the water is replaced by air, the flow resistance of the heat exchanger decreases, so the process may happen in less than 0.5 seconds. This draining process is helped by the following connector arrangement. To detach the connector in one embodiment discussed below, the operator would depress a button that operates a three-way valve that cuts off inlet water flow and vents to allow air into the system. Negative pressure on the return side of the connector holds the connector in until air reaches the outlet. At this point, the negative pressure in the system is diminished due to the much lower delta pressure of air flowing through the heat exchanger and then the connector may be easily removed. Removal of the connector seals the outlet so that air does not continue to flow into the cooling system return flow path. The button stays depressed, thereby sealing off the inlet. To attach the connector, the operator would insert the coupling, which would connect the return path, and the button would automatically release, which would allow the supply flow to reach the components. This system may also be actuated with a twist instead of a button push. The connector may utilize a sacrificial metal, such as zinc or utilize electrical potential to prevent corrosion inside the CPU heat exchanger.

The fluid and vacuum pumps for the system are preferably reliable and have a long life. They should also provide a steady pressure on the suction side, and a low pressure on the outlet, in order to deliver flow to the cooling tower. One preferred design for maximum operational life would be to use a dual chamber pump such as described in, for instance, U.S. Pat. No. 7,611,333, which is incorporated herein by reference, due to the very low net positive suction head required and due to its ability to reject bubbles from the inlet flow. Such a pump, when driven by a vacuum pump and an air compressor, could provide a very low inlet pressure and an independent output pressure. This type of pump could be fitted with additional backup vacuum pumps and compressors connected with check valves so that any single point failure would not cause a system-wide failure. In addition, the check valves and pressurization and vacuum valves and controls could include redundant units.

An alternative would be to use a fluid pump and a vacuum pump. For the fluid pump, a seal-less centrifugal pump with a magnetic drive would work well, as would a solenoid pump with an internal fluidic check valve, such as is described by Tesla in U.S. Pat. No. 1,329,559, which is incorporated herein by reference. In these cases, a fluid pump could be placed in parallel with a vacuum pump, with both connected to a reservoir. The vacuum pump could be a piston type with a Teflon or similar seal, which has a long lifetime, or it could be a linear pump or a diaphragm pump. The pump must be compatible with the humidity and any chemical used to prevent corrosion or biofilm growth. A float valve, as is well known in the art, may be used to keep water out of the inlet of the vacuum pump.

In one embodiment, the system contains a reservoir of cool water, which supplies water to a heat exchanger, with the heated water returned to one or more reservoirs maintained partly full of water, the water level being maintained by a vacuum pump and a water pump.

The vacuum reservoir may include a regulator to maintain constant pressure and a level switch, such that if the liquid level is too high, the liquid pump speed is increased, sucking liquid out of reservoir and pumping it into a cooling tower. This provides a constant pressure differential to multiple heat sources.

For a system that uses a liquid pump, it may be necessary to prime the system. This may be accomplished by turning the liquid pump off and allowing fluid to flow backwards through the pump. A flow actuated shuttle valve in the pump output may be at a default off position allowing the vacuum pump to suck fluid into the reservoir. Once the liquid pump is primed and the level sensor activated, the liquid pump may then turn on and pump the fluid out of the reservoir and into the cooling tower.

The heat exchanger may use a helical flow pattern to put a long path into a short passage. This may be accomplished by placing a threaded rod in a metal tube so that the flow must take a long path through the heat exchanger at a high velocity. This has the added benefit of reducing the volume of water in the heat exchanger, thereby reducing the amount of water that needs to be cleared to service the heat exchanger. Alternatively, a rod with a tortuous path in relief may be used to increase the water flow and turbulence. The rod and cylinder may be square or of any other cylindrical shape. The turbulator may be designed so that some of the water flows over the flow passages in an axial direction. This axial flow will interact with the helical flow to provide swirl in the heat transfer passages in order to increase heat transfer. In addition, the axial flow will reduce the flow resistance of the heat exchanger. This arrangement may be particularly useful in situations where the flow is laminar. For high power dissipation systems, multiple parallel turbulators may be used. In some installations, a flat plate heat exchanger may be used.

Although a CPU is described, this system may be used to cool any electronic component. Although water is described, any coolant may be used instead of or in addition to water. Although the system is described as using water for evaporation and for cooling, a liquid to liquid heat exchanger may be used to transfer heat from an evaporative system to a closed system so that a non-corrosive or non-conductive coolant may be used for the CPUs. This may be used in the case of evaporative coolers which use salt water or reclaimed water, for example. For low temperature operation, as in Northern latitudes, a radiator, fan and glycol system may be used to reject the heat and prevent freezing of the coolant. Since CPUs can get up to 60 C, water can be heated to 50 C and used for hot water service. The water used for cooling the computers may be kept at a temperature higher than the dew point of the air in the data center to prevent condensation on the plumbing or the heat exchangers.

BRIEF DESCRIPTION OF THE DRAWINGS

FIG. 2 is a top view of a typical air and water-cooled heat exchanger with turbulator.

FIG. 3 is a section view of a typical air and water cooled heat exchanger with turbulator.

FIG. 4 is an isometric view of a typical turbulator.

FIG. 9a is a section view of a vacuum accumulator used to prevent drops of water from leaving the system when it is disconnected, shown in a low-vacuum condition.

FIG. 9b is a section view of the vacuum accumulator of FIG. 9a, shown in a high-vacuum condition.

DETAILED DESCRIPTION OF EXAMPLE EMBODIMENTS

The following detailed description presents a description of certain example embodiments of the present invention. In this description, reference is made to the drawings wherein like parts are designated with like numerals throughout.

Figure 1:
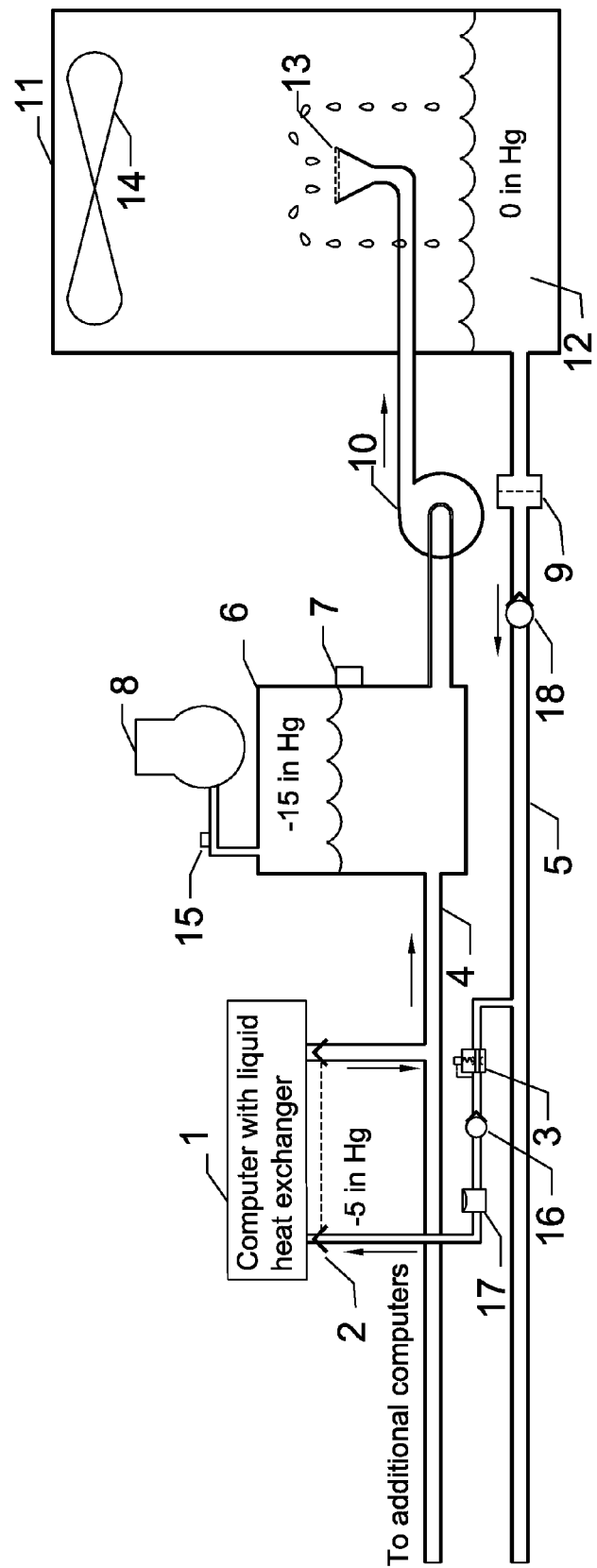
FIG. 1 is a diagram of a vacuum-pumped liquid cooling system according to one embodiment

Referring to the example embodiment shown in FIG. 1, a supply of liquid coolant such as water 12 is maintained at a low temperature by the evaporation of the water as it flows out of nozzle 13. The humid air flows out due to fan 14 in cooling tower 11. Due to the low pressure in the reservoir 6, the water flows through a filter 9, and check valve 18 and a supply pipe 5, through a pressure regulator 3, through another check valve with a cracking pressure of approximately 1 inch Hg, through a vacuum accumulator 17 and then through a fluid connector 2, to the computer with internal heat exchanger 1. The water then receives heat from the internal electronic components in the computer and flows out through the connector to an extraction pipe 4 and then to the reservoir 6. A vacuum is maintained within the reservoir by the vacuum pump 8. The vacuum pump 8 may be controlled by the pressure sensor 15 to maintain an absolute pressure which is above the vapor pressure of the water in its heated state. The reservoir 6 may include a level sensor 7 such that if a certain level is exceeded, the liquid pump 10 speeds up, thereby pumping liquid out of the reservoir 6 and into the cooling tower 11. The cooling tower 11 will require makeup water to replace water that is evaporated, as is known in the art of evaporative coolers generally. In addition, a system may be required to prime the pump 10, as is known in the art of pumps.

Referring to FIG. 2, an example air and water heat exchanger 200 comprises a water cooling portion 210, which includes inlet tube 22 and outlet tube 23 to provide water (not shown) to the turbulator 20 (shown in more detail in FIG. 4), and a metal heat spreader 24 that is in thermal contact with the electronic device (not shown) on one side and the water on the other. A series of fins 21 are provided in thermal contact with flowing air in the event that the liquid cooling system is not operational. A fan (not shown) would typically be used in proximity to the fins 21 to provide cooling air. A turbulator 20 fits inside the metal heat spreader 24 and reduces the amount of water needed to cool the device and increases the velocity and turbulence level in the water. In this device 200, the water inlet 22 may be adapted to provide a point of jet impingement cooling closest to the heat source, and to flow the water in a helical path through the turbulator 20 to the outlet tube 23. In some cases a portion of the flow may flow over the helical flow passages in the turbulator 20 in a short circuit from the inlet 22 to the outlet 23. This flow may enhance heat transfer by causing the helical flow to swirl.

FIG. 3 shows a partial cross-sectional side view of the air and water heat exchanger 200 shown from the top in FIG. 2. The turbulator 20 can be seen installed in the heat spreader 24, and providing a narrow helical path 25 for the cooling water. The CPU is not shown in this view; it would normally be attached to the bottom or lower portion of the heat spreader 24. FIG. 4 provides an isometric view of the turbulator 20, which shows the helical flow path 25 more clearly.

Figure 5:
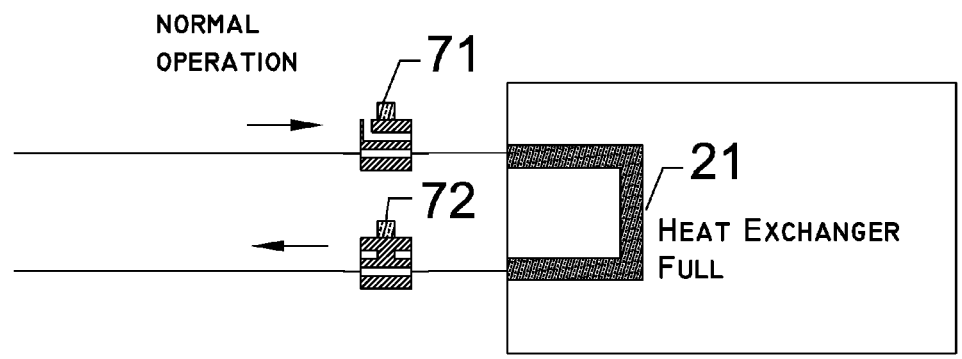
FIG. 5 is a diagram showing an example water clearing disconnect system under normal operation.

FIG. 5 provides a diagram of an example water clearing system in normal operation, depicting the water flowing through a supply valve 71 and, and then through a heat exchanger, 21, and then out through a return valve 72. In this configuration the valves 71, 72 are sealed from the outside air.

Figure 6:
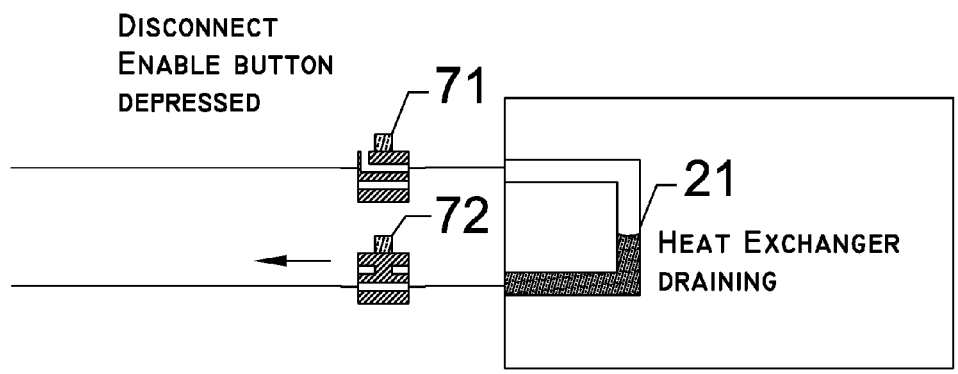
FIG. 6 is a diagram showing an example water clearing disconnect system during the disconnect process.

FIG. 6 shows a diagram of the water clearing system of FIG. 5 during the disconnect process. Before disconnecting the fluid supply and extraction lines (not shown), the user activates valve 71 which allows air to flow into the heat exchanger 21, shown schematically. The valve 71 may be connected to a latch (not shown) that prevents the fluid lines from being removed until the valve is depressed. The latch can be configured to remain in a latched position, so valve 71 remains activated until the connector (not shown) is reinserted into the computer.

Figure 7:
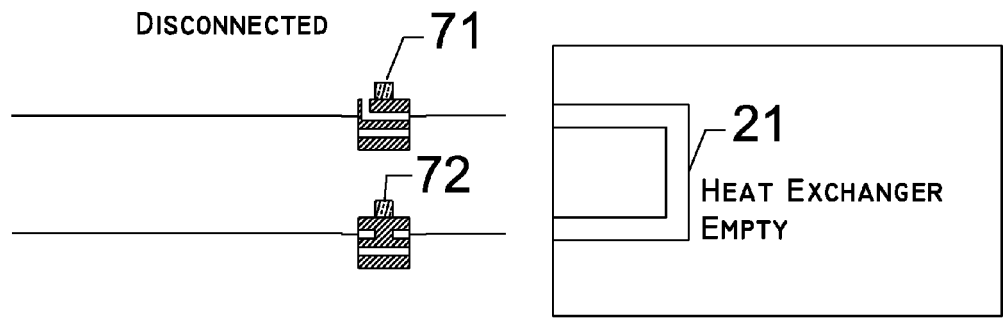
FIG. 7 is a diagram showing an example water clearing disconnect system in a disconnected state.

FIG. 7 shows a diagram of the water clearing system of FIG. 5 upon completion of the disconnect process, such that the heat exchanger 21 is disconnected from the liquid cooling system. In this case, the supply valve 71 remains activated so that air does not flow into the cooling system. And return valve 72 is also activated so that air does not flow into the cooling system. Return valve 72 may be activated by a pin or latch (not shown) so that it shuts off when the heat exchanger 21 is disconnected from the liquid cooling system. The connector may be designed to be retained until all the liquid is removed from the heat exchanger. This retaining feature would be activated by the subatmospheric pressure due to the suction in the return line. However, once the heat exchanger was no longer full of water, there would be less delta pressure across the heat exchanger.

Figure 8:
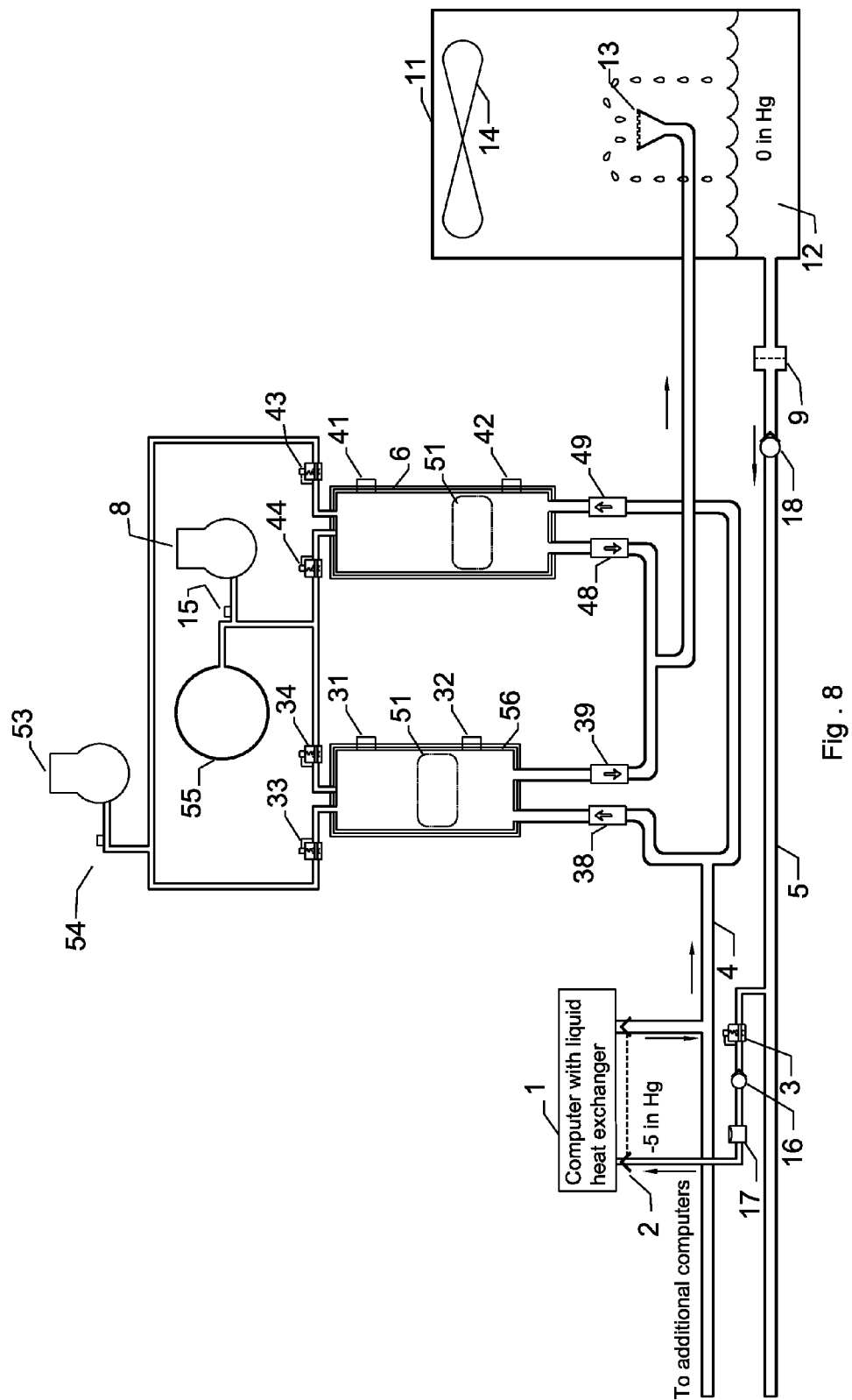
FIG. 8 is a diagram of an alternate embodiment of a vacuum-pumped liquid cooling system.

Referring now to the example embodiment shown in FIG. 8, the centrifugal pump 8 and reservoir 6 of FIG. 1 have been replaced by a multiple chamber pump which acts as a vacuum pump, reservoir, water/air separator and pressure pump. In this embodiment, the system may use two reservoirs: a main reservoir 6, and an auxiliary reservoir 56. The operation of this system is as follows: the water flows in to the reservoir 6 from the extraction pipe 4 through the check valve 49 under suction. The pressure in the reservoir 6 is maintained at a low level by vacuum pump 8, which is connected to the reservoir by open valve 44. A vacuum reservoir 55 may be used to provide a steadier suction. The water flows into the reservoir 6 until the level sensor 41 indicates that the reservoir 6 is nearly full. Then the valve 34 opens, lowering the pressure of auxiliary reservoir 56 so that water may flow into it as well through check valve 38. Once flow is established into both reservoirs 6, 56, valve 44 shuts and valve 43 opens, thereby pressurizing main reservoir 6 so that water flows through check valve 48 and into the cooling tower 11. Then the level in reservoir 6 reaches a low level, as indicated by level sensor 42, at which time the valve 43 shuts. Then the valve 44 opens and flow is established under suction into the main reservoir again, at which time the auxiliary reservoir vacuum valve 34 is shut and the pressurization valve 33 is opened, forcing water out through check valve 39 until the level in the reservoir reaches the low level sensor 32. The level sensor 31 can be used to indicate if there is a system failure. Under normal operation it would not be needed because the system is designed so that the flow out of the reservoirs 6, 56 is higher than the flow into the reservoirs 6, 56, so the auxiliary reservoir 56 is never completely full, thereby allowing for the flow through the heat exchangers 1 to be steady while the flow to the cooling tower 11 is intermittent. The pressure and vacuum levels can be monitored by the pressure pump 53 and the vacuum pump 8 using the pressure sensors 54 and 15. The entire system can be controlled by a computer or by a logic circuit. A float 51 may be used to sense the level and reduce evaporation of the water in the reservoirs.

Referring to FIGS. 9*a* and 9*b*, a vacuum accumulator 17 is shown, having a liquid inlet 61 and liquid outlet 63. The vacuum accumulator 17 comprises a flexible diaphragm 62 which may be flat or nearly flat when no pressure differential exists between inside and outside the accumulator 17, as in FIG. 9*a*. When a vacuum or pressure less than the external atmosphere is provided by the system inside accumulator 17, the diaphragm 62 is displaced into the liquid and holds a steady position as shown in FIG. 9*b*. If the CPU is disconnected from the rest of the system, then the check valve 16 shuts and the diaphragm 62 springs back into the flat position as in FIG. 9*a*. This tends to prevent dripping of liquid out of the system.

While the invention has been described in connection with specific embodiments thereof, it will be understood that it is capable of further modification, and this application is intended to cover any variations, uses, or adaptations of the invention following, in general, the principles of the invention and including such departures from the present invention as would be understood to those in the art as equivalent and the scope and context of the present invention is to be interpreted as including such equivalents and construed in accordance with the claims appended hereto.

The invention claimed is:

1. A system for cooling an electrical device, comprising:
    a fluid-containing heat exchanger thermally coupled to the electrical device;
    a fluid-containing reservoir in fluid communication with the heat exchanger, the reservoir further comprising a main chamber and an auxiliary chamber, each chamber containing a coolant fluid;
    a pressure pump in pressure communication with each chamber through at least one pressure valve for each chamber, wherein the pressure pump pressurizes either chamber when the respective pressure valve for one of the main chamber or auxiliary chamber is actuated;
    a vacuum pump in vacuum communication with each chamber through at least one vacuum valve for each chamber, wherein the vacuum pump depressurizes either chamber when the respective vacuum valve for one of the main chamber or auxiliary chamber is actuated;
    and a controller connected to each pressure valve and each vacuum valve;
    wherein the controller actuates the pressure valves and the vacuum valves to serially pressurize and depressurize the main and auxiliary chambers and thereby cause the coolant fluid to flow from the reservoir through the heat exchanger and back to the reservoir under less than atmospheric pressure.

2. The system of claim 1, further comprising:
    a second fluid-containing heat exchanger in fluid communication with the reservoir, wherein the actuation of the pressure valves and the vacuum valves further causes the coolant fluid to flow through the second heat exchanger.

3. A system for cooling an electrical device, comprising:
    a fluid-containing heat exchanger thermally coupled to the electrical device;
    a fluid-containing reservoir in fluid communication with the heat exchanger, the reservoir further comprising a main chamber and an auxiliary chamber, each chamber containing a coolant fluid;
    a vacuum pump in vacuum communication with each chamber through at least one vacuum valve for each chamber, wherein the vacuum pump depressurizes either chamber when the respective vacuum valve for one of the main chamber or auxiliary chamber is actuated;
    and a controller connected to each vacuum valve;
    wherein the controller actuates the main chamber vacuum valve, then deactivates the main chamber vacuum valve and then actuates the main chamber vacuum valve, and wherein a first period is defined by time between actuations of the main chamber vacuum valve;
    wherein the controller actuates the auxiliary chamber vacuum valve, then deactivates the auxiliary chamber vacuum valve and then actuates the auxiliary chamber vacuum valve, and wherein a second period is defined by time between actuations of the auxiliary chamber vacuum valve;
    wherein the first period is offset from the second period such that there are times when the main chamber vacuum valve is actuated while the auxiliary chamber vacuum valve is deactivated causing the coolant fluid to flow from the reservoir through the heat exchanger and back to the reservoir under less than atmospheric pressure.

4. The system of claim 3, further comprising:
    an evaporative cooling tower in fluid communication with and thermally coupled to the coolant fluid.

5. The system of claim 3, wherein the fluid-containing heat exchanger further comprises a turbulator adapted to cause the coolant fluid to flow in a helical path.

6. The system of claim 3, wherein the coolant fluid flows over a plated surface.

7. The system of claim 1, further comprising:
    a fluid level sensor located in the reservoir and providing an output based on the level of the fluid in the reservoir, the fluid pump being adapted to operate in response to the output of the fluid level sensor.

8. The system of claim 1, further comprising:
    a fluid level sensor located in the reservoir and providing an output based on the level of the fluid in the reservoir, the fluid pump being adapted to operate in response to the output of the fluid level sensor and to maintain the fluid level in the reservoir within a range.

9. The system of claim 3, further comprising:
a vacuum regulator in vacuum communication with the vacuum pump and adapted to maintain a pressure in the reservoir less than atmospheric pressure.

10. The system of claim 3, further comprising:
a fluid filter in fluid communication with the fluid-containing heat exchanger and adapted to prevent debris from entering the fluid-containing heat exchanger.

11. The system of claim 3, further comprising:
a coolant fluid pressure regulator in fluid communication with the fluid-containing heat exchanger, the coolant fluid pressure regulator adapted to provide a constant pressure differential across the fluid-containing heat exchanger.

12. The system of claim 3, further comprising:
a vacuum accumulator in fluid communication with the fluid-containing heat exchanger.

13. The system of claim 3, further comprising:
a connector releasably connecting the fluid-containing heat exchanger to the fluid-containing reservoir, the connector adapted to release the fluid-containing heat exchanger from the fluid-containing reservoir only when substantially all of the coolant fluid has been evacuated out of the fluid-containing heat exchanger.

14. The system of claim 3, further comprising a plurality of fluid-containing heat exchangers thermally coupled to a plurality of electrical devices.

15. The system of claim 1, wherein each chamber contains a fluid level sensor adapted to detect the level of coolant fluid in the respective chamber, and each sensor is connected to the controller, wherein the controller pressurizes and depressurizes the main and auxiliary chambers based on the coolant fluid levels detected in the chambers.

16. The system of claim 3, wherein the fluid-containing heat exchanger is adapted to transfer heat from the electrical device to the air surrounding the fluid-containing heat exchanger, further comprising a fan adapted to move air past the fluid-containing heat exchanger.

17. The system of claim 3, further comprising a pressure pump in pressure communication with each chamber through at least one pressure valve for each chamber, wherein the pressure pump pressurizes either chamber when the respective pressure valve for one of the main chamber or auxiliary chamber is actuated and wherein each pressure valve is connected to the controller.

* * * * *